United States Patent
Seppänen et al.

(10) Patent No.: US 6,255,806 B1
(45) Date of Patent: Jul. 3, 2001

(54) SUPPLY DEVICE FOR POWER SUPPLY TO AN ELECTRONIC UNIT IN A SEMICONDUCTOR VALVE IN A SHUNT-CONNECTED THYRISTOR-SWITCHED CAPACITOR

(75) Inventors: Ari Seppänen; Björn Broo, both of Ludvika (SE)

(73) Assignee: ABB AB, Vasteras (SE)

( * ) Notice: Subject to any disclaimer, the term of this patent is extended or adjusted under 35 U.S.C. 154(b) by 0 days.

(21) Appl. No.: 09/622,410

(22) PCT Filed: Feb. 22, 1999

(86) PCT No.: PCT/SE99/00236

§ 371 Date: Oct. 2, 2000

§ 102(e) Date: Oct. 2, 2000

(87) PCT Pub. No.: WO99/49558

PCT Pub. Date: Sep. 30, 1999

(30) Foreign Application Priority Data

Mar. 23, 1998  (SE) .................................................. 9800956

(51) Int. Cl.[7] ........................................................ F05F 1/70
(52) U.S. Cl. ............................................................ 323/210
(58) Field of Search .................................. 323/205, 208, 323/209, 210, 211

(56) References Cited

U.S. PATENT DOCUMENTS

| | | | |
|---|---|---|---|
| 3,821,564 | 6/1974 | Lindblom et al. | |
| 4,472,674 | * 9/1984 | Yano et al. | 323/210 |
| 4,475,739 | * 10/1984 | Nakajima et al. | 277/216 |
| 4,571,535 | * 2/1986 | Gyugyi | 323/211 |
| 4,638,238 | * 1/1987 | Gyugyi et al. | 323/211 |
| 5,268,833 | 12/1993 | Axer . | |
| 5,434,497 | * 7/1995 | Larsen | 323/209 |
| 5,907,234 | * 5/1999 | Sadek et al. | 323/210 |
| 5,969,509 | * 10/1999 | Thorvaldsson | 323/210 |
| 6,025,701 | * 2/2000 | Weinhold | 323/207 |
| 6,107,785 | * 8/2000 | Griffiths | 323/209 |

FOREIGN PATENT DOCUMENTS

WO 94/18687   8/1994  (EP) .

* cited by examiner

Primary Examiner—Adolf Deneke Berhane
(74) Attorney, Agent, or Firm—Connolly Bove Lodge & Hutz

(57) ABSTRACT

A supply device (FD1, FD2) for power supply to an electronic unit (EU1, EU2) for a controllable semiconductor element (T1, T2) in a semiconductor valve in a shunt-connected thyristor-switched capacitor (CA). The capacitor being intended to carry an alternating current with a known period (T), the semiconductor valve comprising a snubber circuit (SC) with a first and a second terminal (CS1 and CS2, respectively) only. The supply device has an energy storage (C1, C2) for storing electrical energy, a valve terminal (J13, J23), a snubber terminal (J12, J22), a supply terminal (J11, J21) connected to the energy storage and a first current path from the snubber terminal to the supply terminal. The energy storage is designed to store an amount of energy which is larger than the energy requirement of the electronic unit during one cycle of the alternating current but smaller than its energy requirement during two cycles.

6 Claims, 4 Drawing Sheets

SUPPLY DEVICE FOR POWER SUPPLY TO AN ELECTRONIC UNIT IN A SEMICONDUCTOR VALVE IN A SHUNT-CONNECTED THYRISTOR-SWITCHED CAPACITOR

TECHNICAL FIELD

The present invention relates to a supply device for power supply to an electronic unit for a controllable semiconductor element in a semiconductor valve in a shunt-connected thyristor-switched capacitor, the capacitor being intended to carry an alternating current with a known period, the semiconductor valve comprising a snubber circuit for transient protection of the semiconductor element with a first and a second terminal only.

BACKGROUND ART

It is known to connect, to electric power networks in shunt connection, static compensators for compensation of the reactive power consumption of the power network and of equipment connected to the power network. One type of such compensators comprises at least one and usually a plurality of thyristor-switched capacitors (TSC). A thyristor-switched capacitor substantially comprises a capacitor in series connection with a controllable semiconductor valve. In addition thereto, an inductive element, an inductor, is usually arranged in series connection with the capacitor to limit the rate of change of the current through the capacitor when the capacitor is connected to the power network and to avoid resonance phenomena with inductive components located in the power network.

The controllable semiconductor valve comprises at least two controllable semiconductor elements, usually thyristors, arranged in anti-parallel connection. By bringing the semiconductor elements in a conducting state, that is, by controlling their firing time relative to the phase position of the voltage of the ac network, the capacitor may be coupled to the power network for generating reactive power. It is to be understood that, in this application, the concept capacitor comprises also those cases where the capacitor is composed of a plurality of mutually connected capacitive elements, sub-capacitors, which are all commonly coupled by the controllable semiconductor valve. Further, it is to be understood that the semiconductor valve may comprise a plurality of mutually series-connected, and then usually pair-wise antiparallel-connected, semiconductor elements, which are each controlled by a firing order. A control device generates individual firing pulses for the semiconductor elements included in the semiconductor valve.

FIG. 1 illustrates a static compensator of the kind described above, which is connected via a transformer TR to an ac network N1. The compensator comprises three capacitors CA, CB, CC, each being shunt-connected to a common voltage busbar BB via a controllable semiconductor valve VA, VB, VC, respectively, and an inductor LA, LB, LC, respectively. The semiconductor valves are schematically illustrated in the figure with two semiconductor elements T1, T2 in antiparallel connection. Control equipment CEQ supplies firing orders COA, COB, COC, respectively, to the semiconductor valves.

For a general description of thyristor-switched capacitors and control thereof, reference is made to, for example, Åke Ekström: High Power Electronics HVDC and SVC, Stockholm 1990, in particular pages 10-1 to 10-7.

Since the current through the thyristor-switched capacitor in steady state has a phase position 90 electrical degrees in advance of the voltage across the same, the two antiparallel-connected semiconductor elements of the semiconductor valve should be given firing orders alternately at the times when the time rate of change of the fundamental tone for the voltage across the thyristor-switched capacitor changes sign from a positive value to a negative value, and inversely. If the phase position of the voltage is defined such that, at 0°, its amplitude is zero and increasing in a positive direction, under steady-state conditions these sign reversals take place at the electrical angles 90° and 270°. When the above-mentioned time rate of change changes sign from a positive to a negative value, a firing order should be given to that of the semiconductor elements, the conducting direction of which coincides with the expected current direction in the next interval, that is, with the above-mentioned convention, in the interval 90° to 270°. When the mentioned time rate of change again changes signs, a firing order is given to the other semiconductor element, the conducting direction of which coincides with the expected current direction in the interval which is then to follow, that is, with the above-mentioned convention, in the interval 270° to 450°.

When the generation of firing orders is brought to an end, for example in dependence on a voltage control system for maintaining the voltage in the ac network or the voltage busbar BB constant, the current through the semiconductor valve will cease at the next zero crossing of the current. The voltage of the capacitor thus remains at a level determined by the voltage of the power network when the current through the capacitor was forced to cease. When a firing order is again generated, according to the criterion mentioned above, and the voltage of the voltage busbar has remained unchanged, the connection of the capacitor occurs, in principle, without any transition phenomena in current and voltage.

Usually, each semiconductor element is associated with an electronic unit with an indicating device which, in some manner known per se, generates indicating signals, indicating that an off-state voltage exists across the semiconductor elements, in the respective conducting direction of the semiconductor elements. Typically, an indicating signal is generated when the off-state voltage amounts to about 50 V across a semiconductor element in the form of a thyristor. These indicating signals are usually transferred from the potential of the semiconductors via light guides to the control equipment arranged at ground potential.

Likewise, in some manner known per se, the control equipment generates, in dependence on received indicating signals, firing orders and supply these to the electronic units, also usually via light guides. In general, therefore, the electronic units comprise circuits with components, for example photodiodes, for transforming the firing order in the form of light into electrical firing signals for each of the semiconductor elements.

To limit current and voltage stresses on the semiconductor elements in connection with a change of their conducting state, a transient protection circuit, a so-called snubber circuit, is usually arranged in parallel connection with the semiconductor elements, this circuit comprising a series connection of resistive and capacitive components.

The above-mentioned functions of the electronic units require electrical energy and the electronic units must therefore have access to a power supply. This power supply should be galvanically separated from ground potential and the electric power should thus be supplied from that ac network to which the thyristor-switched capacitor is connected.

The electronic units usually also comprise a gate circuit which forwards, to the semiconductor elements, firing orders received from the control equipment for firing the respective semiconductor element in dependence on the voltage level of the supply voltage.

A known way of arranging this power supply for thyristor-switched capacitors is illustrated in FIG. 2. The figure schematically illustrates parts of a semiconductor valve of the kind described above, which comprises two thyristors T1, T2 in antiparallel connection, a snubber circuit SC with a snubber capacitor CS and a snubber resistor RS in series connection. Supply devices FD1 and FD2, respectively, are adapted to supply electronic units (not shown in the figure) for the thyristors T1, T2, respectively, with electrical energy. Each one of the supply devices comprises an energy storage in the form of a capacitor, in the figure designated C1 and C2, respectively. The voltage across the capacitors, in the figure designated UF1 and UF2, is supplied to the respective electronic units. A current transformer—not shown in its entirety in the figure—with a primary winding, through which the alternating current through the thyristor-switched capacitor flows, has a number of separate secondary windings, two of which, designated S1 and S2, respectively, are shown in the figure. The supply device FD1 further comprises diodes Da1 and Da2. When current flows through the secondary winding S1, a current path through the supply device FD1 is closed via the diode Da2, the capacitor C1, and via a Zener diode Zc in a supply device FD2', which is adapted for power supply of an electronic unit (not shown) for a thyristor T2', connected in series with the thyristor T2. In the event that the supply device FD2' does not exist, the current path is instead closed via a Zener diode Za' in the supply device FD1. The capacitor C1 is thus supplied with energy via the current through the secondary winding S1.

The thyristor T1 has one anode terminal TA1 and one cathode terminal TC1. When no current flows through the current transformer, that is, when the semiconductor elements are in a non-conducting state, and when the voltage between the anode and cathode terminals exhibits a positive time rate of change, a small amount of energy is supplied to the capacitor C1 through a current path from the anode terminal TA1 via a diode Db1 in the supply device FD2, the snubber circuit SC and a diode D11. Conventionally, the energy storage is designed to contain energy sufficient for the safe function of the electronic unit for a plurality of cycles of the alternating current, which, however, also implies that a plurality of ac cycles are required for supplying, via the snubber circuit, an amount of energy which is large enough for the energy storage to attain a voltage level and an energy content sufficient for the safe function of the electronic unit. Thus, this solution presupposes that the energy requirement of the electronic unit is ensured via supply from a current transformer, which component, of course, complicates and renders more expensive the system for energy supply to the electronic units.

FIG. 3 illustrates a known system for energy supply to electronic units of a corresponding kind in a semiconductor valve included in a converter for conversion between alternating current and high-voltage direct current. A thyristor T1 included in the semiconductor valve has a snubber circuit SC connected between the anode terminal TA1 and the cathode terminal TC1. In this case, the snubber circuit comprises a first series connection of a resistor RS1 and a capacitor CS1, which in turn is connected in series with a second series connection of a resistor RS2 and a capacitor CS2. A third series connection of a capacitor CS3 and a resistor RS3 is connected between the point of connection between the above-mentioned capacitors and a supply device FDH for energy supply of an electronic unit (not shown in the figure) for the thyristor T1. When the voltage between the anode and cathode terminals exhibits a positive time rate of change, a current path is formed from the anode terminal via the first and third series connections, a diode D11 in the supply device and an energy storage in the form of a capacitor C1h to the cathode terminal. The voltage across the capacitor, designated UF1h in the figure, is supplied to the electronic unit. In this case, the energy storage is designed to be charged during each cycle, via the current path mentioned, with an amount of energy which is large enough for the energy storage to attain a voltage level and an energy content sufficient for the safe function of the energy unit during one cycle of the alternating current. In this case, the snubber circuit is designed as a voltage-divider circuit, which implies that only part of the current through the snubber circuit is supplied to the supply device.

SUMMARY OF THE INVENTION

The object of the invention is to achieve an improved supply device or the kind mentioned in the introductory part of the description, which eliminates the need of energy supply via a current transformer, utilizes in full the current through the snubber circuit for energy supply to the supply device and to the electronic unit, and which, through the design of its circuitry, contributes to a simple, reliable and economically advantageous design.

According to the invention, this is achieved by arranging the snubber circuit of the semiconductor element with only one first and one second terminal, the supply device with an energy storage for storing electrical energy, a valve terminal, a snubber terminal, a supply terminal connected to the energy storage, and with a first current path from the snubber terminal to the supply terminal, the valve terminal for connection to the cathode terminal, the snubber terminal for connection to one of the terminals of the snubber circuit, and the supply terminal for connection to the electronic unit, the snubber circuit for connection such that a second current path, for carrying a charge current to the energy storage in a direction from the snubber terminal to the cathode terminal, is formed from the anode terminal through the snubber circuit to the snubber terminal, and therefrom via the energy storage to the cathode terminal, and by designing the energy storage to store an amount of energy which is larger than the energy requirement of the electronic unit during one cycle of the alternating current but smaller than its energy requirement during two cycles.

In this way, the current transformer may be eliminated and a current path may be formed for carrying the whole current through the snubber circuit direct to the electronic unit and to the energy storage of the supply device.

Advantageous improvements of the invention will become clear from the following description and claims.

BRIEF DESCRIPTION OF THE DRAWINGS

The invention will be described in greater detail by description of embodiments with reference to the accompanying drawings, wherein.

DESCRIPTION OF THE PREFERRED EMBODIMENTS

Figure 1:
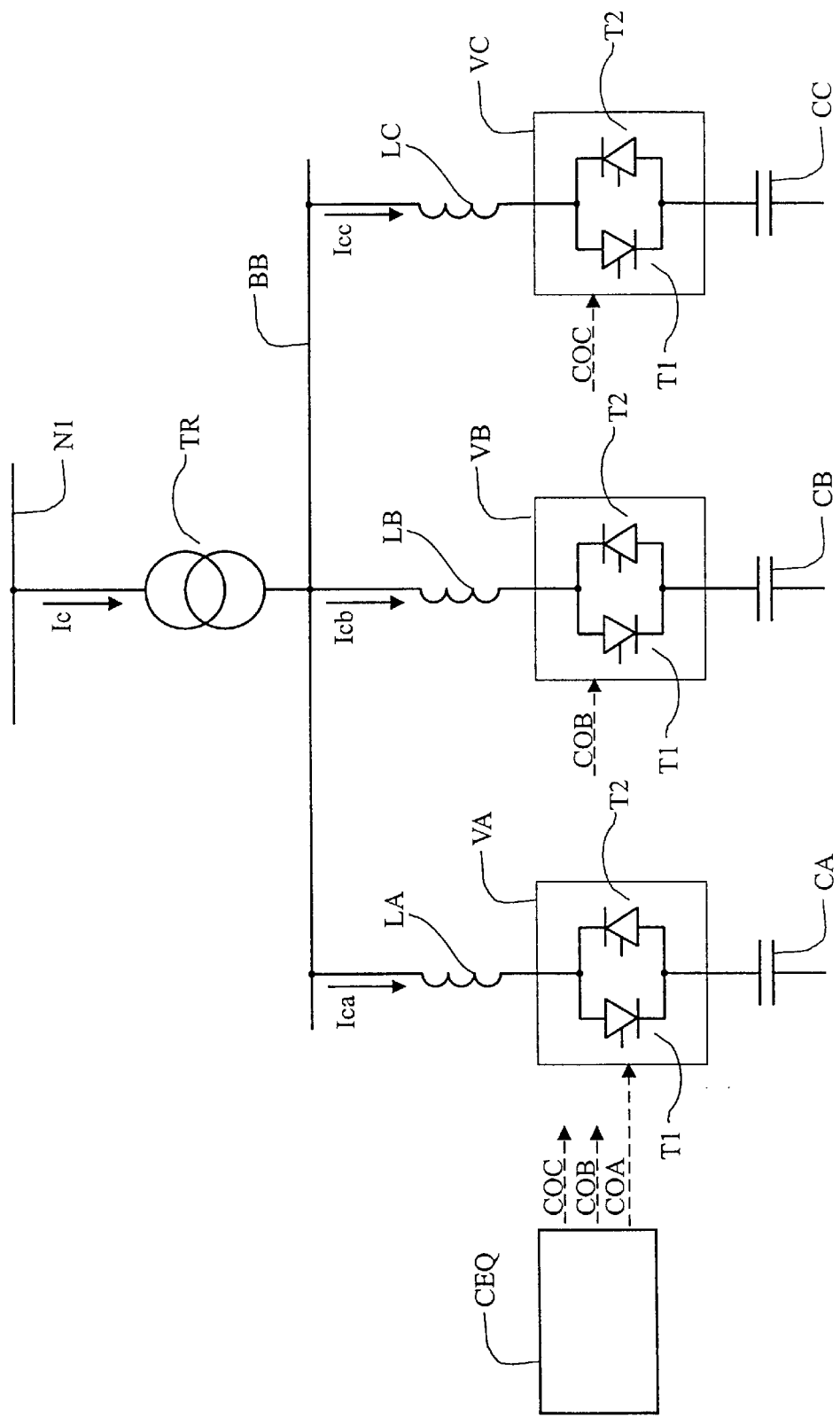
FIG. 1 shows, in the form of a single-line diagram, a static compensator with thyristor-switched capacitors.
Figure 4:
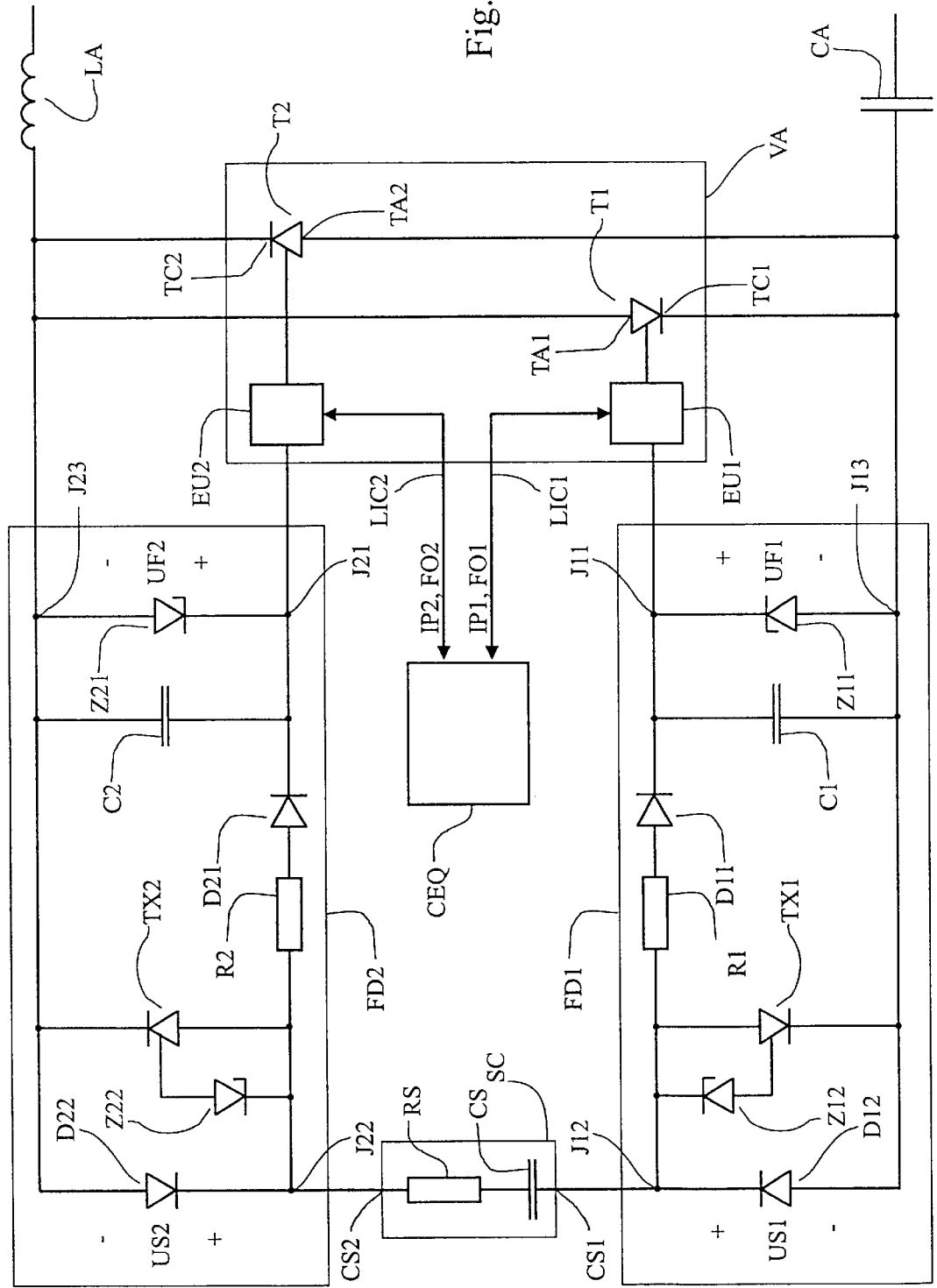
FIG. 4 shows an embodiment according to the invention of a power supply of electronic units for thyristors in a thyristor-switched capacitor according to FIG. 1.

FIG. 4 shows an embodiment of supply equipment according to the invention. A semiconductor valve comprises two semiconductor elements in the form of thyristors T1, T2 in antiparallel connection, each one with an electronic unit EU1, EU2, respectively. The electronic units are of the kind described above and form indicating signals IP1, IP2 which are supplied to control equipment CEQ. The control equipment forms firing orders FO1, FO2, as described above, and supply these to the electronic units. The signal transmission takes place via light guides LIC1, LIC2. Each of the thyristors has an anode terminal TA1, TA2, respectively, and a cathode terminal TC1, TC2, respectively. The anode terminal TA1 and the cathode terminal TC2 are connected to an inductor LA and the anode terminal TA2 and the cathode terminal TC1 are connected to a capacitor CA. The inductor, in its turn, is connected to an ac circuit (not shown in the figure) with a known period T, for example as illustrated in FIG. 1.

Further, the semiconductor valve comprises a snubber circuit SC with a series connection of a resistor RS and a capacitor CS and with only a first terminal CS1 and a second terminal CS2.

Figure 2:
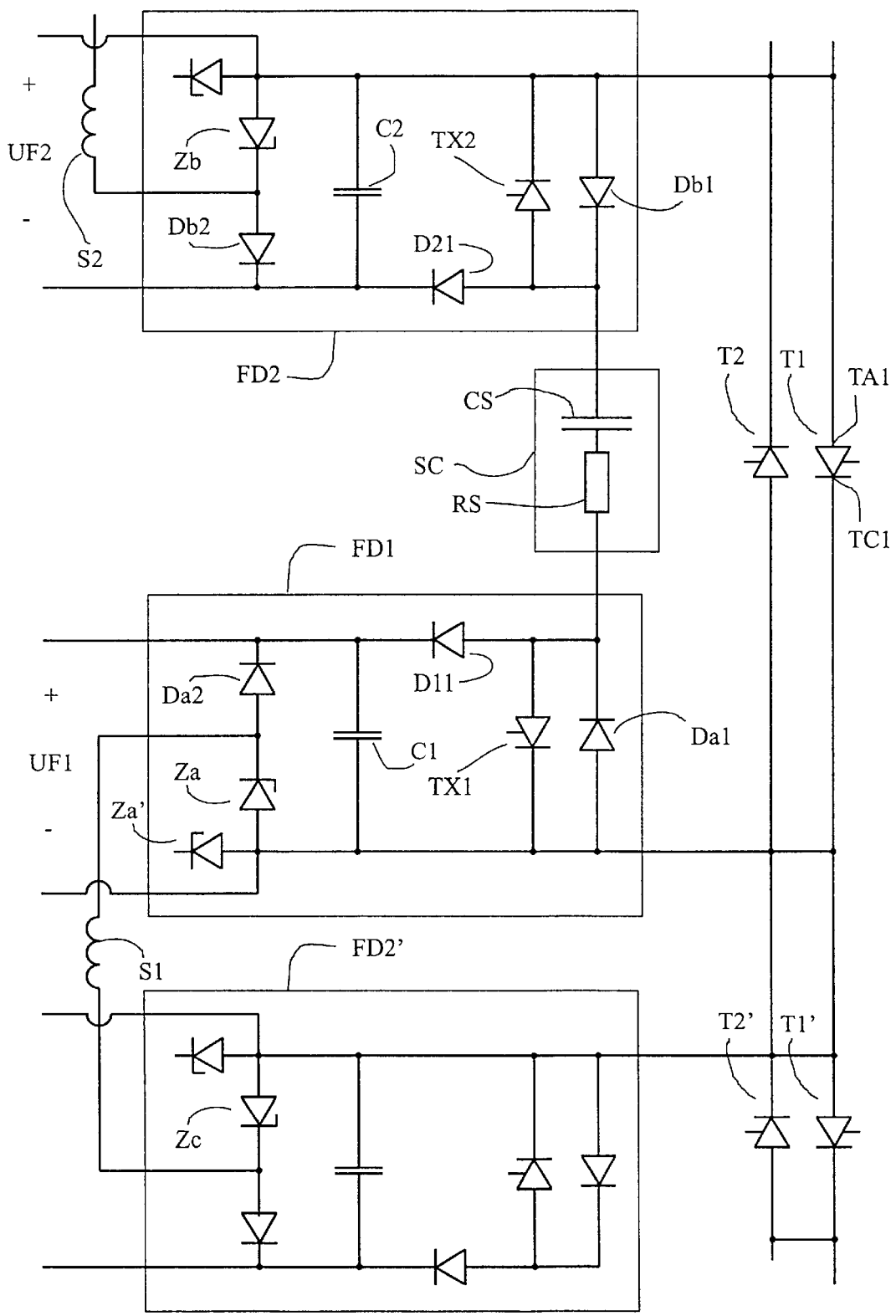
FIG. 2 shows a known embodiment of a power supply of electronic units for thyristors in a thyristor-switched capacitor according to FIG. 1.
Figure 3:
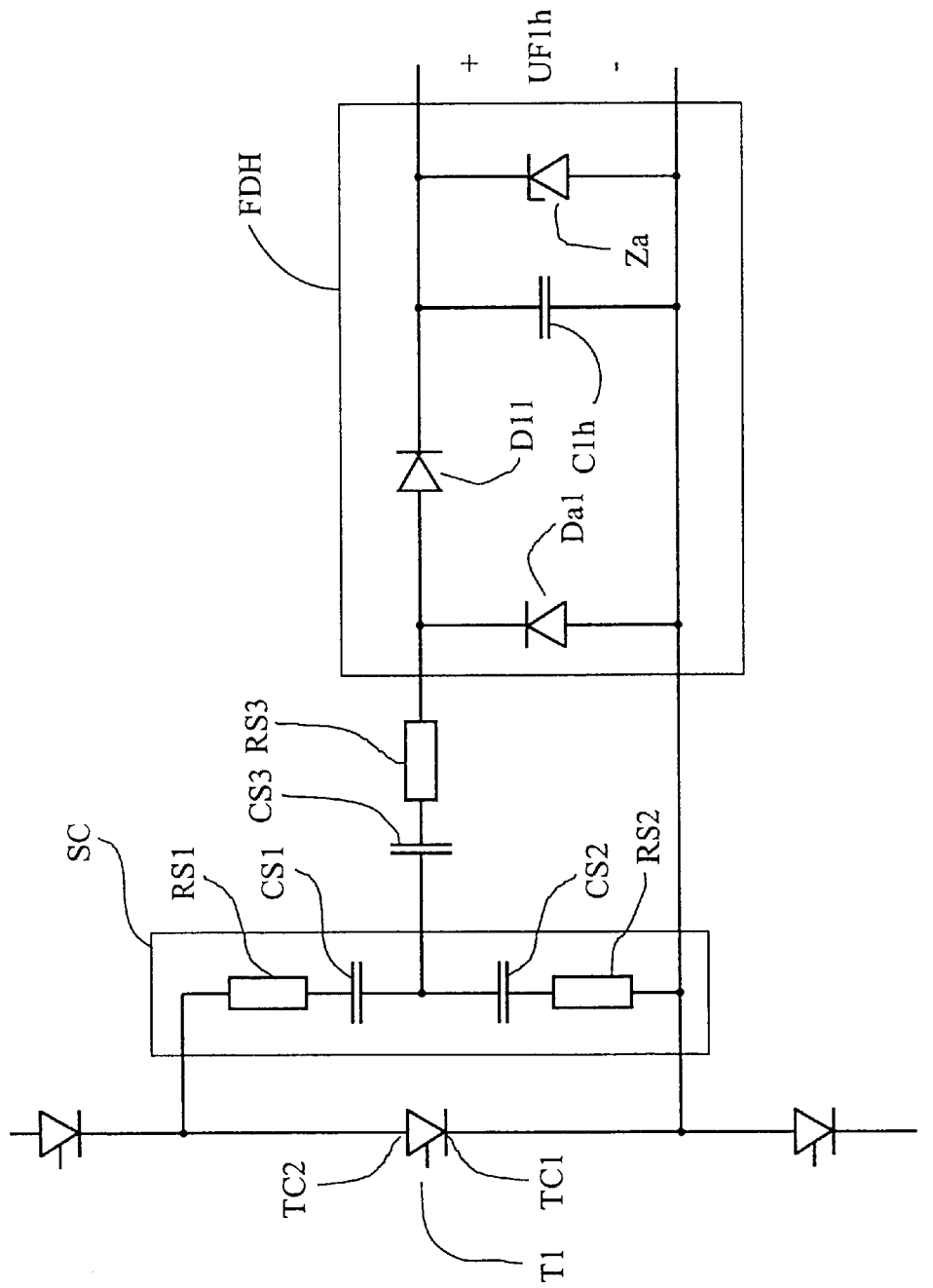
FIG. 3 shows a known embodiment of a power supply of electronic units for thyristors in a semiconductor valve in a converter for conversion between alternating current and high-voltage direct current.

A first supply device FD1 for power supply to the electronic unit EU1 comprises an energy storage in the form of a capacitor C1 for storing electrical energy, a valve terminal J13, a snubber terminal J12, and a supply terminal J11. The capacitor C1 is connected between the valve terminal and the supply terminal. The valve terminal is intended for connection to the cathode terminal of the semiconductor element, the snubber terminal for connection to one of the terminals of the snubber circuit, in this case to the terminal CS1, and the supply terminal for connection to the electronic unit. The supply device comprises a first current path from the snubber terminal via a resistor R1 and a diode D11 to the supply terminal such that a current may flow from the snubber terminal to the supply terminal but not in the reverse direction. For power supply to the electronic unit EU2, a second supply device FD2 of the same kind is provided, the components included in the supply devices and the terminals of the same kind being designated in the figure with the corresponding designations, whereby, for the second supply device, FIG. 1 in the first figure of the reference numerals is replaced by FIG. 2.

The snubber circuit is connected such that a second current path, for carrying a charge current to the energy storage in a direction from the snubber terminal to the valve terminal, is formed from the anode terminal through the snubber circuit to the snubber terminal, and from this via the energy storage and the valve terminal to the cathode terminal. The supply devices further comprise a third current path, parallel with the second current path, from the respective valve terminals via diodes D12 and D22, respectively, to the respective snubber terminals, for carrying a parallel current in a direction from the valve terminal to the snubber terminal and further to the snubber circuit, but not in the reverse direction. The snubber circuit is thus connected as a series circuit between the snubber terminal J12 in the first supply device FD1 and the snubber terminal J22 in the second supply device FD2.

A breakdown diode in the form of a Zener diode Z11 is connected between the supply terminal and the valve terminal for limitation of the voltage UF1 of the supply terminal.

The first current path comprises a branch point, which in this embodiment of the invention consists of the supply terminal J11, such that the first and second current paths coincide with each other between the snubber terminal and the branch point mentioned. The resistor R1, which constitutes a current-limiting element, and the diode D11, are arranged in the coinciding part of the two current paths.

When, for example, the thyristor T1 is to assume the current through the capacitor CA, the condition for firing of the same is that the off-state voltage in its forward direction exceeds a predetermined level, which is transferred to the control equipment CEQ from the electronic unit EU1 via an indicating signal. In dependence on known quantities in the installation, the control equipment generates, in some manner known per se, firing orders FO1, which are supplied to the electronic unit when a corresponding indicating signal has been received.

The build-up of the off-state voltage across the thyristor T1 implies that the time rate of change of the voltage between the anode terminal and the cathode terminal will have a positive sign, that the third current path in the second supply device FD2 is brought to a conducting state and that a charge current will flow through the snubber circuit SC in a direction from the terminal CS2 to the snubber terminal J12 in the first supply device. The third current path in the first supply device is in a nonconducting state, so the charge current in the first supply device flows through the coinciding part of the first and second current paths and, at the branch point between them, is divided into a current which flows directly to the electronic unit and a current which charges the capacitor C1. As long as the voltage UF1 at the supply terminal J11, that is, across the capacitor C1, is below the breakdown voltage of the Zener diode Z11, the capacitor is charged with the charge current. When the mentioned voltage reaches the breakdown voltage, the charge current will flow through the Zener diode.

When the thyristor T1 fires, the voltage across the same returns to a value near zero, whereby a current of short duration flows through the snubber circuit in a direction from the cathode terminal via the diode D12, via the snubber circuit, and in the second supply device FD2 via the resistor R2 and the diode D21 to the capacitor C2 and hence provides a charge addition thereto.

The function in case the thyristor T2 is to assume the current through the capacitor CA is completely analogous to the one described above, whereby, in the description, the second supply changes places with the first one.

In an advantageous improvement of the invention, a shunt regulator, comprising a controllable switching member in the form of an auxiliary thyristor TX1, is arranged between the snubber terminal and the valve terminal. By means of a breakdown diode, in this embodiment a Zener diode Z12, connected between the snubber terminal and the gate of the auxiliary thyristor, the voltage US1 on the snubber terminal is sensed, which voltage thus constitutes a comparison voltage for the predetermined breakdown voltage UZ12 of the Zener diode. When the comparison voltage exceeds the breakdown voltage, the auxiliary thyristor is brought to a conducting state by the current through the breakdown diode and then closes a fourth current path from the snubber terminal via the auxiliary thyristor to the valve terminal for carrying the charge current past the capacitor C1. The voltage at the snubber terminal depends on the sum of the voltage at the supply terminal and the voltage across the resistor R1, whereby the shunt regulator intervenes in dependence on the voltage at the supply terminal as well as the amplitude of the current in the coinciding part of the first and second current paths.

Typical component values for a supply device according to the invention are C1=1 $\mu$F, R1=1 $\Omega$, RS=10 $\Omega$ and CS=2 $\mu$F. The breakdown level of the Zener diode Z11 is typically 25 V and of the Zener diode Z12 typically 47 V. In the known embodiment of a supply device for the same purpose, described with reference to FIG. 2, the capacitor C1 is usually designed to have a capacitance value of typically 20 to 30 $\mu$F, that is, typically of an order of magnitude greater than in the embodiment according to the invention.

When designing the supply device according to the invention, which is done with knowledge of the energy and voltage requirements of the electronic unit, the energy storage, that is the capacitor C1, is designed to store an amount of energy which is larger than the energy requirement of the electronic unit during one cycle of the alternating current but smaller than its energy requirement during two cycles.

This implies that the energy storage is practically emptied in connection with the thyristor T1 being brought to a conducting state. At the next current pulse through the snubber circuit, part of this current pulse may be passed directly to the electronic unit via the first current path. By this series connection of the snubber circuit and the mentioned design of the energy storage, a simple and inexpensive design of the supply equipment, which utilizes in full the current through the snubber circuit, is obtained.

It is to be understood that, in those cases where the semiconductor valve comprises a plurality of mutually series-connected thyristors, each of these is equipped with a supply device of the kind described above and connected over thyristors, which are antiparallel-connected in pairs, in the way illustrated in FIG. 4.

The thyristor-connected capacitor may, of course, also be connected, for example, between two phases in a three-phase ac network.

What is claimed is:

1. A supply device (FD1, FD2) for power supply to an electronic unit (EU1, EU2) for a controllable semiconductor element (T1, T2) in a semiconductor valve in a shunt-connected thyristor-switched capacitor (CA), the capacitor being intended to carry an alternating current with a known period (T), the semiconductor valve comprising a snubber circuit (SC) with a first and a second terminal (CS1 and CS2, respectively) only, the semiconductor element with an anode terminal (TA1, TA2) and a cathode terminal (TC1, TC2), the supply device with an energy storage (C1, C2) for storing electrical energy, with a valve terminal (J13, J23), a snubber terminal (J12, J22), a supply terminal (J11, J21) connected to the energy storage, and with a first current path from the snubber terminal to the supply terminal, the valve terminal for connection to the cathode terminal, the snubber terminal for connection to one of the terminals of the snubber circuit, and the supply terminal for connection to the electronic unit, the snubber circuit for connection such that a second current path, for carrying a charge current to the energy storage in a direction from the snubber terminal to the cathode terminal, is formed from the anode terminal through the snubber circuit to the snubber terminal, and therefrom via the energy storage and the valve terminal to the cathode terminal, characterized in that the energy storage is designed to store an amount of energy which is larger than the energy requirement of the electronic unit during one cycle of the alternating current but smaller than its energy requirement during two cycles.

2. A supply device according to claim 1, characterized in that it comprises a third current path parallel to the second current path from the valve terminal to the snubber terminal for carrying a parallel current in a direction from the valve terminal to the snubber terminal and further to the snubber circuit.

3. A supply device according to claim 1, characterized in that it comprises a shunt regulator (Z12, TX1 and Z22, TX2, respectively) which, when a comparison voltage (US1, US2), depending on the voltage level of the energy storage, exceeds a predetermined voltage level, closes a fourth current path for the charge current past the energy storage.

4. A supply device according to claim 1, characterized in that the first current path comprises a branch point (J11, J21), that the first and second current paths coincide with each other between the snubber terminal and said branch point, and that the coinciding part of the current paths comprises a current-limiting element (R1, R2).

5. A supply device according to claim 4, characterized in that said comparison voltage is dependent on a sum of the voltage (UF1, UF2) at the supply terminal and the voltage across said current-limiting element.

6. A supply device according to claims 3, characterized in that said shunt regulator comprises a breakdown diode (Z12, Z22), for example a Zener diode, for sensing the comparison voltage, and a controllable switching member (TX1, TX2) which closes said fourth current path in dependence on a current through said breakdown diode.

* * * * *